United States Patent
Figuet et al.

(10) Patent No.: US 11,251,265 B2
(45) Date of Patent: Feb. 15, 2022

(54) CARRIER FOR A SEMICONDUCTOR STRUCTURE

(71) Applicants: Centre National de la Recherche Scientifique, Paris (FR); Universite Claude Bernard Lyon 1, Villeurbanne (FR); Soitec, Bernin (FR)

(72) Inventors: Christophe Figuet, Crolles (FR); Oleg Kononchuk, Theys (FR); Kassam Alassaad, Villeurbanne (FR); Gabriel Ferro, Villeurbanne (FR); Véronique Souliere, Saint Marcel Bel Accueil (FR); Christelle Veytizou, Bernin (FR); Taguhi Yeghoyan, Bourgoin-Jallieu (FR)

(73) Assignees: Soitec, Bernin (FR); Centre National de la Recherche Scientifiaue, Paris (FR)

( * ) Notice: Subject to any disclaimer, the term of this patent is extended or adjusted under 35 U.S.C. 154(b) by 207 days.

(21) Appl. No.: 16/080,279

(22) PCT Filed: Feb. 23, 2017

(86) PCT No.: PCT/FR2017/050400
§ 371 (c)(1),
(2) Date: Aug. 27, 2018

(87) PCT Pub. No.: WO2017/144821
PCT Pub. Date: Aug. 31, 2017

(65) Prior Publication Data
US 2019/0058031 A1    Feb. 21, 2019

(30) Foreign Application Priority Data
Feb. 26, 2016 (FR) .................................. 1651642

(51) Int. Cl.
H01L 29/06 (2006.01)
H01L 21/02 (2006.01)
(Continued)

(52) U.S. Cl.
CPC .......... *H01L 29/06* (2013.01); *H01L 21/0245* (2013.01); *H01L 21/0259* (2013.01);
(Continued)

(58) Field of Classification Search
CPC ......... H01L 21/02444; H01L 21/02447; H01L 21/0245; H01L 21/02507; H01L 21/0259;
(Continued)

(56) References Cited

U.S. PATENT DOCUMENTS 5,693,957 A    12/1997 Sano et al.
9,824,891 B1 *  11/2017 Sun .................... H01L 21/0262
(Continued)

OTHER PUBLICATIONS

International Wrtten Opinion for International Application No. PCT/FR2017/050400 dated May 18, 2017, 6 pages.
(Continued)

*Primary Examiner* — Alia Sabur
(74) *Attorney, Agent, or Firm* — TraskBritt

(57) ABSTRACT

A support for a semiconductor structure includes a charge-trapping layer on a base substrate. The charge-trapping layer consists of a polycrystalline main layer and, interposed in the main layer or between the main layer and the base substrate, at least one intermediate polycrystalline layer composed of a silicon and carbon alloy or carbon. The intermediate layer has a resistivity greater than 1000 ohm·cm.

21 Claims, 2 Drawing Sheets

(51) Int. Cl.
   *H01L 21/762* (2006.01)
   *H01L 29/16* (2006.01)
(52) U.S. Cl.
   CPC .... *H01L 21/0262* (2013.01); *H01L 21/02444* (2013.01); *H01L 21/02447* (2013.01); *H01L 21/02507* (2013.01); *H01L 21/02595* (2013.01); *H01L 21/7624* (2013.01); *H01L 21/76254* (2013.01); *H01L 29/1608* (2013.01)
(58) Field of Classification Search
   CPC .......... H01L 21/02595; H01L 21/0262; H01L 21/7624; H01L 21/76254; H01L 29/06; H01L 29/1608
   See application file for complete search history.

(56) References Cited

U.S. PATENT DOCUMENTS

| | | | |
|---|---|---|---|
| 10,468,486 B2 * | 11/2019 | Wu | H01L 29/0649 |
| 2006/0073674 A1 | 4/2006 | Fitzgerald et al. | |
| 2010/0171195 A1 | 7/2010 | Tobe et al. | |
| 2013/0168835 A1 * | 7/2013 | Botula | H01L 21/76254 257/632 |
| 2015/0115480 A1 * | 4/2015 | Peidous | H01L 21/76251 257/798 |
| 2016/0071959 A1 * | 3/2016 | Thomas | H01L 21/02002 257/324 |
| 2019/0080957 A1 * | 3/2019 | Peidous | H01L 21/84 |

OTHER PUBLICATIONS

International Search Report for International Application No. PCT/FR2017/050400 dated May 18, 2017, 2 pages.
European Communication pursuant to Article 94(3) EPC for European Application No. 17710350, dated Jan. 28, 2021, 6 pages.
Japanese Notice of Reasons for Refusal for Japanese Application No. 2018-544865 dated Jan. 21, 2021.

* cited by examiner

CARRIER FOR A SEMICONDUCTOR STRUCTURE

CROSS-REFERENCE TO RELATED APPLICATIONS

This application is a national phase entry under 35 U.S.C. § 371 of International Patent Application PCT/FR2017/050400, filed Feb. 23, 2017, designating the United States of America and published as International Patent Publication WO 2017/144821 A1 on Aug. 31, 2017, which claims the benefit under Article 8 of the Patent Cooperation Treaty to French Patent Application Serial No. 1651642, filed Feb. 26, 2016.

TECHNICAL FIELD

The present disclosure relates to a support for a semiconductor structure.

BACKGROUND

Integrated devices are usually formed on substrates that serve mainly as a support for their manufacture. However, the increase in the degree of integration and the performances expected of these devices give rise to a greater and greater coupling between their performances and the characteristics of the substrate on which they are formed. This is particularly the case with RF that process signals with a frequency of between approximately 3 kHz and 300 GHz, which find, in particular, application in the field of telecommunications (telephony, Wi-Fi, BLUETOOTH®, etc.).

By way of example of device/substrate coupling, electromagnetic fields resulting from high-frequency signals propagate in the integrated devices, enter the depth of the substrate and interact with any charge carriers that are present in the substrate. The result is an unnecessary consumption of some of the energy of the signal through loss of coupling and possible influences between components by cross-talk.

According to a second example of coupling, the charge carriers of the substrate may cause the generation of undesired harmonics, which may interfere with the signals propagating in the integrated devices and degrade their qualities.

These phenomena are, in particular, observable when the substrate used comprises a buried layer of insulator material, located between a support and a useful layer on and in which the integrated devices are formed. The charges trapped in the insulator lead to accumulating, under this layer of insulator, in the support, charges with complementary signs forming a conductive plane. In this conductive plane, the mobile charges are liable to interact strongly with the electromagnetic fields generated by the components of the useful layer.

To guard against or limit this phenomena, inserting, between the buried insulator and the support, directly under the insulator, a charge-trapping layer, for example, a 1- to 5-micron layer of polycrystalline silicon, is known. The grain boundaries between the grains of silicon constitute traps for the charge carriers, these being able to come from the trapping layer itself or from the underlying support. In this way, the appearance of a conductive plane under the insulator material is prevented.

The device/substrate coupling then depends on the intensity of interaction of the electromagnetic fields with the mobile charges of the support. The density and/or mobility of these charges depend on the resistivity of the support.

When the resistivity of the substrate is relatively great (and, therefore, a relatively low charge density), greater than 1000 ohm·cm, a trapping layer 1 to 5 microns thick may be adapted to limit the device/substrate coupling. In this way, the integrity of the signals and, therefore, the radio-frequency performance of the integrated devices of the useful layer are preserved.

When, on the other hand, the resistivity of the substrate is lower, below 1000 ohm·cm, or when the expected performance of the integrated device is high, it would be desirable to be able to form a very thick trapping layer, greater than 5 microns, or even 10 or 15 microns, to push deeper into the substrate the zone in which the charges are mobile. It would thus be possible to prevent the interactions with the electromagnetic fields propagating very deeply, and to further improve the performance of the integrated devices of the useful layer.

However, it was observed that a thickness of trapping layer greater than 5 microns did not lead to the expected improvement in performance.

The document U.S. 2015/0115480 discloses a substrate comprising a support for a semiconductor substrate, the support being provided with a trapping layer formed by a stack of polycrystalline or amorphous layers of silicon, silicon germanium, silicon carbide and/or germanium. These layers are passivated. In other words, their interfaces consist of a fine layer of insulator such as silicon oxide or silicon nitride. Such passivation is obtained, according to this document, by exposing the free surface of these layers during their manufacture to an environment rich in oxygen or nitrogen.

According to this document, the multilayer structure of the trapping layer would make it possible to prevent the phenomenon of recrystallization of the polycrystalline trapping layer when the substrate is exposed to a very high temperature, for example, during the manufacture thereof or the manufacture of integrated devices on this substrate. When the trapping layer recrystallizes, even partially, the RF performances of the substrate and of the integrated devices that will be formed thereon are affected, which is, of course, not desirable.

The support proposed by this document does not, however, give complete satisfaction.

First, the fine layers of passivation insulator that this document envisages forming are not generally stable at elevated temperature, in particular, when this insulator is silicon dioxide. Exposure of the support to high temperature may lead to the dissolution of the oxide in the polycrystalline layers, and to the disappearance of the passivation layers. The trapping layers are then liable to recrystallize if the high-temperature treatment of the support continues.

If these insulating passivation layers are formed with sufficient thickness to ensure stability under elevated temperature, they then form barriers to the diffusion of the charges present in the support and in the layers of the stack. When the traps of a layer of the stack are all saturated with charge carriers, the charge carriers remain confined in the layer and accumulate therein, and cannot be driven toward other traps available in other layers of the stack. The RF performance of the substrate is, therefore, adversely affected thereby.

In addition, the charges trapped in the relatively thick insulating passivation layers lead to forming conductive planes under their surface, reproducing the phenomena observed under a buried oxide layer of an SOI structure that were described previously. The polycrystalline structure of the trapping layers can only partially compensate for this quantity of additional charges. Once again, the RF performance of the substrate is adversely affected thereby.

The present disclosure aims to overcome all or some of the aforementioned drawbacks.

BRIEF SUMMARY

The present application discloses a support for a semiconductor structure comprising a charge-trapping layer disposed on a base substrate. According to the disclosure, the charge-trapping layer comprises a polycrystalline main layer and, interposed in the main layer or between the main layer and the base substrate, at least one intermediate layer composed of a silicon and carbon alloy or of carbon, the intermediate layer having a resistivity greater than 1000 ohm·cm.

The charge-trapping layer is, in this way, stable at elevated temperature, without having the drawbacks of the insulating passivation layers of the prior art.

According to other advantageous and non-limitative features of the disclosure, taken alone or in any technically achievable combination:
- the base substrate has a resistivity above 1000 ohm·cm;
- the charge-trapping layer has a thickness of more than 10 microns;
- the support comprises between 1 and 10 intermediate layers;
- the polycrystalline main layer consists of grains of silicon with a size of between 100 nm and 1000 nm;
- each intermediate layer has a thickness of less than 10 nm or 5 nm;
- the support comprises an insulating layer on the charge-trapping layer;
- the polycrystalline intermediate layer or layers are composed of a silicon and carbon alloy having more than 5% carbon, such as silicon carbide.

The subject matter of the disclosure also relates to a semiconductor structure comprising such a support, an insulating layer on the support and a useful layer on the insulating layer. The useful layer may contain at least one component.

Finally, the subject matter of the disclosure relates to a method for manufacturing a semiconductor structure comprising the following steps:
a. supplying a support as previously described;
b. forming, on this support, the semiconductor structure.

The formation step b may comprise the transfer of a useful layer onto the support.

The useful layer may comprise at least one integrated device.

BRIEF DESCRIPTION OF THE DRAWINGS

Other features and advantages of the disclosure will emerge from the detailed description that follows with reference to the accompanying figures, in which.

DETAILED DESCRIPTION

Figure 1:
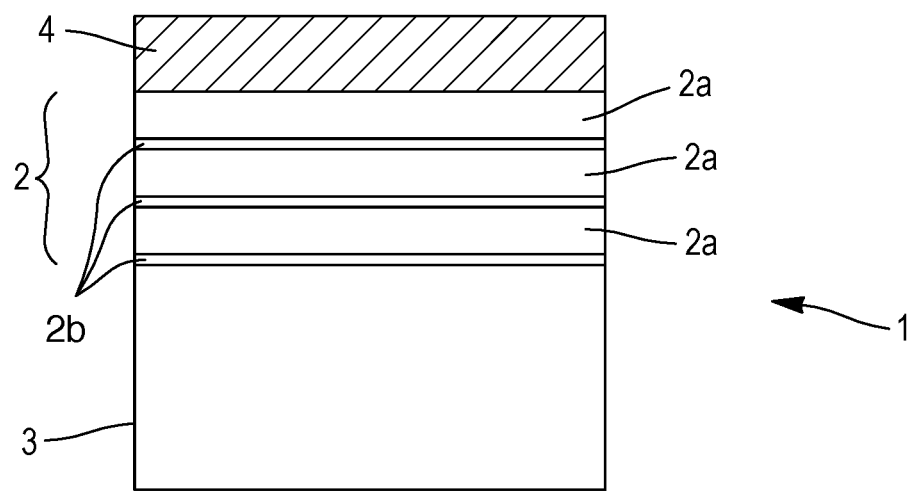
FIG. 1 schematically shows a support for a semiconductor structure according to the disclosure.

FIG. 1 schematically shows a support for a semiconductor structure according to the disclosure. The support 1 may be in the form of a circular wafer, of standardized size, for example, 200 mm or 300 mm, or even 450 mm in diameter. However, the disclosure is in no way limited to these dimensions or to this form.

Thus, in the case where the semiconductor structure is a finished or semi-finished integrated device, the support 1 will take the form of a block of material with a rectangular or square longitudinal section, the dimensions of which, from a few millimeters to a few centimeters, correspond to the dimensions of the integrated device.

The support 1 comprises a base substrate 3, typically several hundreds of microns thick. Preferentially, and in particular, when the support 1 is intended to receive a semiconductor structure the expected RF performance of which is high, the base substrate has high resistivity, greater than 1000 ohm·cm, and more preferentially still greater than 3000 ohm·cm. In this way, the density of the charges, holes or electrons that are liable to move in the base substrate is limited. However, the disclosure is not limited to a base substrate having such resistivity, and also procures advantages in RF performance when the base substrate has a more typical resistivity of around a few hundred ohm·centimeters or less.

For reasons of availability and cost, the base substrate is preferentially made from silicon. It may, for example, be a CZ substrate with a small interstitial oxygen content that has, as is well known per se, a resistivity that may be greater than 1000 ohm·cm. The base substrate may alternatively be formed from another material such as, for example, sapphire, silicon carbide, etc.

The support 1 also comprises, directly in contact with the base substrate 3, a charge-trapping layer 2. As mentioned in the details in the introduction to the present application, the function of the charge-trapping layer is to trap any charge carriers that may be present in the support 1 and to limit the mobility thereof. This is particularly the case when the support 1 provided with a semiconductor structure emitting an electromagnetic field penetrating the support is, therefore, liable to interact with these charges.

According to the disclosure, the charge-trapping layer 2 comprises a polycrystalline main layer 2a.

For the same reasons of availability and cost that have already been mentioned, the main layer 2a is preferentially made from polycrystalline silicon. However, it may be formed from another semiconductor and polycrystalline material, or comprise a part (for example, a section of main layer 2a of the charge-trapping layer 2 in FIG. 1) made from another semiconductor and polycrystalline material. The main layer 2a may be made, for example, of germanium, silicon germanium, etc.

In all cases, the main layer 2a has a high resistivity above 3000 ohm·centimeter. For this purpose, the main layer 2a is not intentionally doped, that is to say, it has a concentration of dopant of less than $10^{14}$ atoms per cubic centimeter. It may be rich in nitrogen or carbon in order to improve its resistivity.

The charge-trapping layer 2 also comprises, interposed between the main layer 2a or between the main layer 2a and the base substrate 3, at least one intermediate layer 2b composed of a silicon and carbon alloy or of carbon, having a resistivity above 1000 ohm·centimeter. These are materials that are very stable under elevated temperature. In other words, even when exposed to very high temperatures exceeding those that are generally used for manufacturing semiconductor structures (500° C. to 1300° C.), these materials keep their micro- and macroscopic structure. As will be described in more detail hereinafter, the silicon and carbon alloy or the carbon constituting the intermediate layer 2b can be formed by depositing silicon and carbon or by surface carbonization. The intermediate layer 2b is generally polycrystalline in nature but, when it is formed by carbonization of a crystalline base substrate 3, the intermediate layer 2b may have a crystalline or partially crystalline nature.

According to the disclosure, the charge-trapping layer 2 consists of the main layer 2a and at least one intermediate layer 2b. Provision is not made for incorporating other layers, in particular, electrically insulating layers, which might modify the advantageous properties of the proposed trapping layer.

By interposing at least one intermediate layer 2b in the polycrystalline main layer 2a or under this layer, a stack is formed that is stable under temperature, which prevents the recrystallization of the polycrystalline main layer 2a during any heat treatments to which the support 1 may be subjected.

With it being a case of resistive semiconductor materials, the drawbacks relating to the use of an insulating material are overcome. In addition, their properties of resistivity and polycrystallinity contribute to the trapping of the charges in the charge-trapping layer 2, similarly to what occurs in the main layer 2a.

When the support 1 comprises a plurality of intermediate layers 2b, these may be of the same nature or a different nature, this nature remaining chosen from the list of aforementioned materials.

The charge-trapping layer 2 consisting, on a base substrate, of the main layer 2a and at least one intermediate layer 2b, therefore forms a support for a semiconductor structure that is stable under elevated temperature, unlikely to recrystallize, and effective for trapping charge carriers. The trapping layer 2 has, in fact, a very high density of traps accessible to charges.

In addition, by interposing at least one intermediate layer 2b in the main layer 2a, it was observed, surprisingly, that it was possible to form a charge-trapping layer 2 with a thickness greater than 2 microns, improving the RF performance of the support.

This property is illustrated with reference to FIG. 2, the description of which follows. On standard CZ silicon substrates, polycrystalline silicon layers according to the prior art and of increasing thickness were formed. For each of these layers, and on their surfaces, the mean size of the grains of the polycrystal was recorded by SEM (scanning electron microscopy) imaging.

Figure 2:
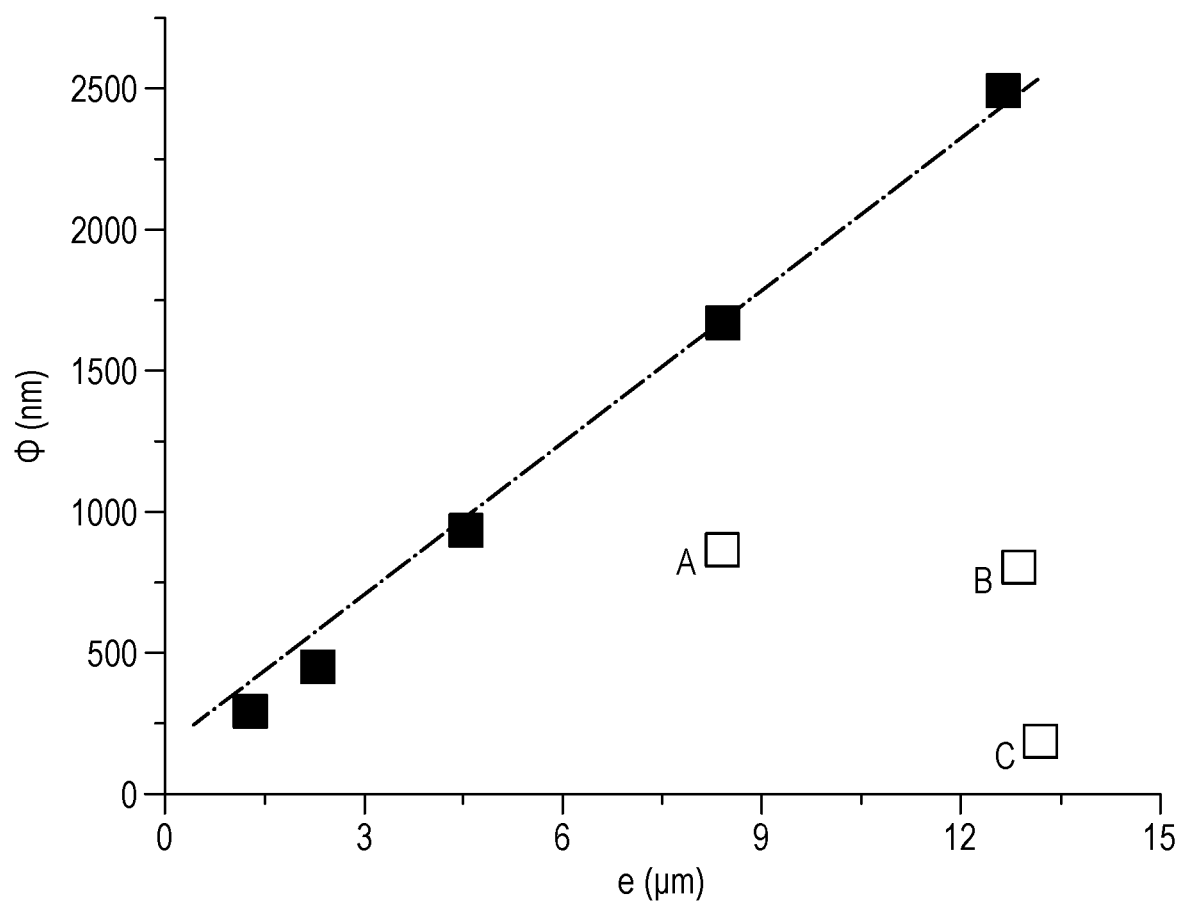
FIG. 2 illustrates the relationship existing between the thickness of a polycrystalline layer and the mean size of the grains on the surface of this layer.

The graph in FIG. 2 shows (in the form of a black square) the relationship existing between the thickness of a polycrystalline layer (on the X axis and in microns) and the mean size of the grains on the surface of this layer (on the Y axis and in nanometers). It is observed that, the thicker the layer, the larger the size of the grains.

A thick trapping layer may be required to push the residual charge-carrier zone deeper into the support. However, this, as is observed, causes an increase in the grain size on the surface of the trapping layer. This surface is intended to be placed just under the semiconductor structure and is, therefore, liable to be subjected to a strong magnetic field. The RF performance of the semiconductor structure will, therefore, be very sensitive to the behavior of the charge carriers at this surface and in the vicinity thereof.

However, an increase in the size of the grains poses a problem in two ways. First of all, larger grains cause a smaller grain boundary density. These grain boundaries form a favored zone for trapping the carriers, and the density of the traps is reduced.

Moreover, the grains also form a confinement space for the charge carriers that lie therein. In large grains, for example, of the order of magnitude of an integrated device, the charges behave, as seen from the device, as in a defect-free material.

These two aspects combine to reduce the RF performance of the support when the grains of the polycrystal of the trapping layer are large.

Complementary studies have shown that the size of the grains should preferentially be between 100 nm (below which their thermal stability is no longer ensured and there is a risk of recrystallization thereof under temperature) and 1000 nm (beyond which the RF performance of the support is affected). This grain characteristic has never been able to be obtained for a thickness of the trapping layer greater than approximately 5 microns, and over its entire thickness.

On a base substrate identical to that of the previous example, an intermediate layer of polycrystalline silicon of approximately eight microns was formed. Halfway through this layer, a 1 nm polycrystalline layer of silicon carbide was formed. The grain size on the surface of the polycrystalline silicon layer was measured at around 800 nm.

On a second base substrate, a layer of polycrystalline silicon of approximately 13 microns was formed. Five 80-nm layers of silicon carbide were interposed evenly in the polycrystalline layer. The grain size on the surface of this layer was measured at around 800 nm.

On a third base substrate, a layer of polycrystalline silicon of approximately 13 microns was formed. Eleven 40-nm thick layers of silicon carbide were interposed evenly in the polycrystalline layer. The grain size on the surface of this layer was measured at around 125 nm.

The three measurements were placed on the graph in FIG. 2 and respectively marked A, B, C on this graph.

It is very apparent on this figure that inserting intermediate layers makes it possible to control the change in the size of the grains in the thickness of the trapping layer and that it is possible to obtain grains with sizes between 100 and 1000 nanometers, even for thicknesses of layers greater than 5 or 10 microns.

According to a (non-limitative) hypothesis of interpretation of these results, the intermediate layer (or layers) composed of a silicon and carbon alloy has a greater difference in lattice parameter compared with the polycrystalline silicon of the main layer (the lattice parameter of the intermediate layer being smaller than that of the main layer). In this way, a very great density of crystalline defects is generated, and the relationship of epitaxy between the polysilicon layers and the intermediate layer is lost during the growth thereof. The particular polycrystalline arrangement of the main layer under an intermediate layer is lost, and is not reproduced in the portion of the main layer around the intermediate layer.

These observations make it possible to establish advantageous characteristics of the charge-trapping layer 2 according to the present disclosure.

Thus, the trapping layer can advantageously comprise between 1 and 10 intermediate layers. In this way, it is possible, without forming an excessively complex and expensive stack, to control the size of the grains in the main layer 2a, even for great thicknesses of charge-trapping layers 2, above 5 microns, and even above 10 microns.

Preferably, each intermediate layer 2b formed from a silicon and carbon alloy or formed from carbon has a lattice parameter less than the lattice parameter of the material (or materials) forming the main layer 2a.

Advantageously, the thickness of the portion of main layer 2a lying between two successive intermediate layers 2b may be between 0.2 and 2.5 microns. In this way, the grains are prevented from becoming too large in the top part of this portion.

The charge-trapping layer 2 may have a thickness greater than 2 or even 10 microns. Whether its thickness is greater or lesser than these limits, the main layer 2a may be composed of grains with a size between 100 and 1000 nanometers. A support 1 is then obtained having improved RF performance compared with what it is possible to obtain with the supports according to the prior art.

A silicon and carbon alloy, or carbon, forming the intermediate layer or layers may have a thermal expansion coefficient very different from the one forming the main layer 2a. It is in this case preferable to limit their thickness, for example, to less than 10 or 5 nm. In this way, creating stresses in the support 1 is avoided when the support 1 is subjected to high temperature.

The silicon and carbon alloy may be silicon carbide or carbon-doped silicon. Preferentially, the carbon-doped silicon has more than 5% carbon.

Finally, and, as is shown in FIG. 1, the support may have an insulating layer 4 directly on the charge-trapping layer 2. This insulating layer 4, which is optional, may facilitate the assembly of the support 1 with a semiconductor structure.

Manufacturing the support 1 according to the disclosure is particularly simple and achievable with standard deposition equipment of the industry.

According to the example, the base substrate 3 is supplied, which is placed in a conventional deposition chamber. As is well known per se, the base substrate 3 may be prepared before deposition thereof, for example, in order to eliminate a layer of native oxide from its surface. This step is not obligatory, and this oxide may be kept. It is, in fact, sufficiently fine, from 1 to 2 nm, not to have any insulating effect (conduction through this layer by tunnel effect) insofar as future heat treatments have not made it completely disappear by dissolution.

The chamber has a flow of precursor gases travel through it, for example, $SiH_4$, at a temperature of around 1000° C., in order to grow the main layer 2a, in the present case made from polycrystalline silicon.

At given instants in this deposition process, a second precursor gas, for example, $C_3H_8$, can be introduced into the chamber for a given period with a view to forming the intermediate layer or layers 2b.

The flow of the first gas may be interrupted during this interval of time so as to form an intermediate layer 2b rich in, or consisting of, carbon.

Alternatively, the flow of the first gas may be maintained during this time so as to form an intermediate layer 2b consisting of a silicon and carbon alloy. The proportion of carbon and silicon in this alloy may be controlled by adjusting the flows of the respective precursors.

This sequence can be repeated in order to form the charge-trapping layer 2 sought, the duration of circulation of the various flows determining the thickness separating the successive layers 2a, 2b.

When it is desired to dispose an intermediate layer 2b of carbon under the main layer 2a and in contact with the base substrate 3, it may be preferable to eliminate the layer of native oxide that might cover this substrate. It is possible to expose the base substrate directly to the second precursor gas $C_3H_8$, in the absence of the first precursor gas, at a temperature of approximately 1000° C. in order to form the intermediate layer 2b of carbon. It may have a crystalline or partially crystalline nature if the base substrate 3 itself has a crystalline nature.

To form a section of the carbon-rich main layer 2a, it is also possible to make provision for forming this section of layer from polycrystalline silicon, and to anneal this layer in a carbon-rich atmosphere, such as $C_3H_8$. This annealing step can be carried out in situ in the deposition equipment by introducing a carbon-rich atmosphere into the chamber, following the deposition of the section of the main layer 2a.

Whatever the choices made for depositing the charge-trapping layer 2, a support 1 according to the disclosure is available at the end of this deposition phase. It may undergo an optional polishing step on the charge-trapping layer 2 side in order to provide a smooth surface facilitating assembly thereof with a semiconductor structure.

The support may be provided with an insulating layer 4, for example, a silicon oxide or silicon nitride, deposited conventionally. This insulating layer 4 may also be polished.

As already mentioned, the purpose of the support 1 is to receive a semiconductor structure on the same side as the charge-trapping layer 2.

This structure may be formed in many ways on the support 1, but advantageously this formation comprises a step of transferring a useful layer 5 onto the support.

As is well known per se, this transfer is usually carried out by assembling the face of a donor substrate on the support 1. This may or may not be provided with the insulating layer 4. In the same way, the donor substrate may have been provided in advance with an insulating layer 6 of the same nature as, or a different nature from, the insulating layer 4. It may, for example, be silicon oxide or silicon nitride.

After this assembly step, the donor substrate is reduced in thickness in order to form the useful layer 5. This reduction step can be carried out by mechanical or chemical thinning. It may also be a case of a fracture at a fragile zone previously introduced into the donor substrate, for example, in accordance with the principles of SMART CUT® technology.

Steps of finishing the useful layer 5, such as a polishing step, a heat treatment under reducing or neutral atmosphere or a sacrificial oxidation can be concatenated with the step of reduction in thickness.

Figure 3:
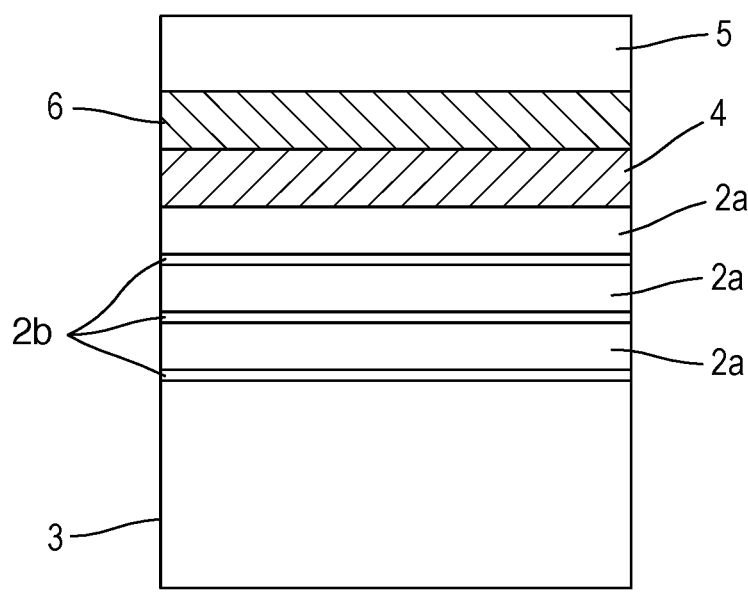
FIG. 3 shows a substrate of the semiconductor-on-insulator type comprising a support according to the disclosure.

When the donor substrate is a simple substrate, that is to say, does not comprise any integrated device, a substrate of the semiconductor-on-insulator type is formed in which the useful layer 5 is a layer of blank semiconductors, comprising the support of the disclosure and as shown in FIG. 3. The substrate can then be used for forming integrated devices.

When the donor substrate has previously been treated in order to form integrated devices on its surface, at the end of this method, a useful layer 5 that comprises these devices is available.

"Semiconductor structure" means an integrated device whether or not it is formed from semiconductor materials. For example, it may be a device of the surface or volume acoustic wave type, typically produced on and in a layer of piezoelectric material, such as lithium tantalate.

"Semiconductor structure" also means a layer of blank device materials, whether or not based on semiconductor material, and in which integrated devices can be formed.

The invention claimed is:

1. A support for a semiconductor structure comprising a charge-trapping layer disposed on a base substrate, wherein the charge-trapping layer consists of a polycrystalline main layer and, interposed in the main layer or between the main layer and the base substrate, at least one intermediate layer composed of a silicon and carbon alloy or carbon, the intermediate layer having a resistivity greater than 1000 ohm·cm.

2. The support of claim 1, wherein the base substrate has a resistivity greater than 1000 ohm·cm.

3. The support of claim 2, wherein the charge-trapping layer has a thickness greater than 5 microns.

4. The support of claim 3, wherein the at least one intermediate layer comprises from one to ten intermediate layers.

5. The support of claim 4, wherein the at least one intermediate layer consists of a single intermediate layer composed of carbon between the main layer and the base substrate.

6. The support of claim 5, wherein the polycrystalline main layer consists of silicon grains with a size of between 100 nm and 1000 nm.

7. The support of claim 6, wherein each intermediate layer has a thickness of less than 10 nm.

8. The support of claim 1, further comprising an insulating layer on the charge-trapping layer.

9. The support of claim 1, wherein the at least one intermediate layer is composed of a silicon and carbon alloy having more than 5% carbon.

10. The support of claim 9, wherein the at least one intermediate layer comprises silicon carbide.

11. A semiconductor structure, comprising:
a support according to claim 1;
an insulating layer on the support; and
a useful layer on the insulating layer.

12. The semiconductor structure of claim 11, wherein the useful layer comprises at least one integrated device.

13. A method for manufacturing a semiconductor structure comprising the following steps:
providing a support according to claim 1; and
forming the semiconductor structure on the support.

14. The method of claim 13, wherein forming the semiconductor structure on the support comprises transferring a useful layer onto the support.

15. The method of claim 14, wherein the useful layer comprises at least one integrated device.

16. The support of claim 1, wherein the charge-trapping layer has a thickness greater than 5 microns.

17. The support of claim 1, wherein the at least one intermediate layer comprises from one to ten intermediate layers.

18. The support of claim 1, wherein the at least one intermediate layer consists of a single intermediate layer composed of carbon between the main layer and the base substrate.

19. The support of claim 1, wherein the polycrystalline main layer consists of silicon grains with a size of between 100 nm and 1000 nm.

20. The support of claim 1, wherein each intermediate layer has a thickness of less than 10 nm.

21. The support of claim 1, wherein each intermediate layer is a polycrystalline or crystalline layer.

* * * * *